United States Patent [19]

Lange

[11] Patent Number: 5,404,052

[45] Date of Patent: Apr. 4, 1995

[54] BASE DRIVE CIRCUIT

[75] Inventor: Arnold C. Lange, Livermore, Calif.

[73] Assignee: The United States of America as represented by the United States Department of Energy, Washington, D.C.

[21] Appl. No.: 968,112

[22] Filed: Oct. 29, 1992

[51] Int. Cl.$^6$ .......................... H03K 5/01; H03K 3/286
[52] U.S. Cl. ...................................... 327/109; 327/478
[58] Field of Search ............... 307/242, 268, 279, 581, 307/584, 595

[56] References Cited

U.S. PATENT DOCUMENTS

| | | | |
|---|---|---|---|
| 4,786,824 | 11/1988 | Masuda | 307/268 |
| 4,868,425 | 9/1989 | Lindenfelser | 307/268 |
| 4,912,420 | 3/1990 | Parnell | 307/268 |
| 4,937,468 | 6/1990 | Shekhawat et al. | 307/268 |
| 5,120,985 | 6/1992 | Kimura | 307/268 |
| 5,153,451 | 10/1992 | Yamamura et al. | 307/268 |
| 5,155,398 | 10/1992 | Mikuni et al. | 307/584 |
| 5,264,736 | 11/1993 | Jacobson | 307/268 |

Primary Examiner—Willis R. Wolfe, Jr.
Attorney, Agent, or Firm—Miguel A. Valdes; Roger S. Gaither; William R. Moser

[57] ABSTRACT

An improved base drive circuit (10) having a level shifter (24) for providing bistable input signals to a pair of non-linear delays (30, 32). The non-linear delays (30, 32) provide gate control to a corresponding pair of field effect transistors (100, 106) through a corresponding pair of buffer components (88, 94). The non-linear delays (30, 32) provide delayed turn-on for each of the field effect transistors (100, 106) while an associated pair of transistors (72, 80) shunt the non-linear delays (30, 32) during turn-off of the associated field effect transistor (100, 106).

20 Claims, 2 Drawing Sheets

BASE DRIVE CIRCUIT

BACKGROUND OF THE INVENTION

The invention described herein arose in the course of, or under, contract No. W-7405-ENG-48 between the United States Department of Energy and Lawrence Livermore National Laboratory.

The present invention relates generally to electronic circuitry, and more particularly to an improved means for controlling bistable switching circuits, particularly high power circuits for an electron beam gun.

Electronic switching circuits are well known in the art, and a number of methods have been employed to cause semiconductors be behave much like switches. The goal of an electronic switching circuit generally is to switch, as rapidly as possible, between a highly resistive "off" state and a relatively highly conductive "on" state, and vice versa, with as little transition time as possible between these two states. The advent of modern Insulated Gate Bipolar Transistors ("IGBT"), which can switch power in the range of 300 KW and above, has presented yet another instance in which such rapid switching is necessary, since power is dissipated in the IGBT during any transition and the IGBT is incapable of dissipating more than a very small fraction of the power that is being switched. This is but one example of the many applications wherein this sort of high speed electronic switching is required.

In many switching circuits it has been customary to provide a control signal to the actual switching component which varies between a zero volt potential and some non-zero potential. Such circuitry can be relatively simple, but it suffers from two primary problems. Firstly, a switching component may not respond as rapidly to a signal returning to its zero potential as it would to a signal which crosses over zero potential. Secondly, in such circuits, potential relative to the zero reference of the unipolar power supply is usually established by a resistor, which will result in a delay in either turn-on or turn-off time, depending upon how the resistor is used in the circuit.

Bipolar switching control circuits are also known in the art. However, such circuits have usually been relatively complex. Alternatively, a less sophisticated circuit may be used if some timing errors may be tolerated in a bipolar switching control circuit, provided that components are used which will withstand the instantaneous stresses caused by such timing errors.

No switching control circuit, to the inventor's knowledge, has successfully provided an effective means for providing a bipolar signal having both rapid turn-on and turn-off times without either using very complex circuitry or, alternatively, without allowing some tolerance for at least instantaneous simultaneous "on" and "off" signal states under some operating conditions. All prior art switching control circuits have provided a unipolar bistable signal, and/or have provided a signal which has a less than desirable rise or fall time, and/or have been prohibitively complex in construction.

SUMMARY OF THE INVENTION

Accordingly, it is an object of the present invention to provide a switching control circuit which will provide a bipolar bistable output.

It is another object of the present invention to provide a bipolar switching control circuit which will insure that the bipolar power sources are not shorted together, even instantaneously.

It is still another object of the present invention to provide a switching control circuit which provides a signal having both a rapid rise time and a rapid fall time.

It is yet another object of the present invention to provide a switching control circuit suitable for controlling an IGBT switch.

It is still another object of the present invention to provide a means for providing a control signal that switches rapidly between a positive value and a negative value.

Briefly, the preferred embodiment of the present invention is a switching control circuit having a pair of output switching transistors for switching $+15$ v and $-15$ v, respectively, to a control output. A bistable unipolar input to the switching control circuit is first level shifted to provide separate input signals to a pair of non-linear delay circuits. The two non-linear delay circuits provide input signals to the corresponding output switching transistors such that turn-off of each of the output switching transistors is nearly instantaneous, while turn-on time is delayed, thus insuring that both of the output transistors cannot be conducting simultaneously.

An advantage of the present invention is that an output signal having both rapid rise time and rapid fall time is provided.

A further advantage of the present invention is that an output signal which switches between a positive voltage and a negative voltage is provided.

Yet another advantage of the present invention is that the timing control circuitry is simple and reliable.

Still another advantage of the present invention is that it is inexpensive to produce.

Yet another advantage of the present invention is that it can operate relative to a floating zero potential ground.

Still another advantage of the present invention is that it allows the use of components which would not withstand the timing errors inherent in prior art switching means.

These and other objects and advantages of the present invention will become clear to those skilled in the art in view of the description of the best presently known mode of carrying out the invention and the industrial applicability of the preferred embodiment, as described herein and as illustrated in the several figures of the drawing.

DETAILED DESCRIPTION OF THE INVENTION

The best presently known mode for carrying out the invention is an improved base drive circuit for providing a control signal to the base of an IGBT. The predominant expected usage of the improved base drive circuit of the present invention is for controlling an IGBT switch in a high power electron beam gun power supply.

Figure 1:
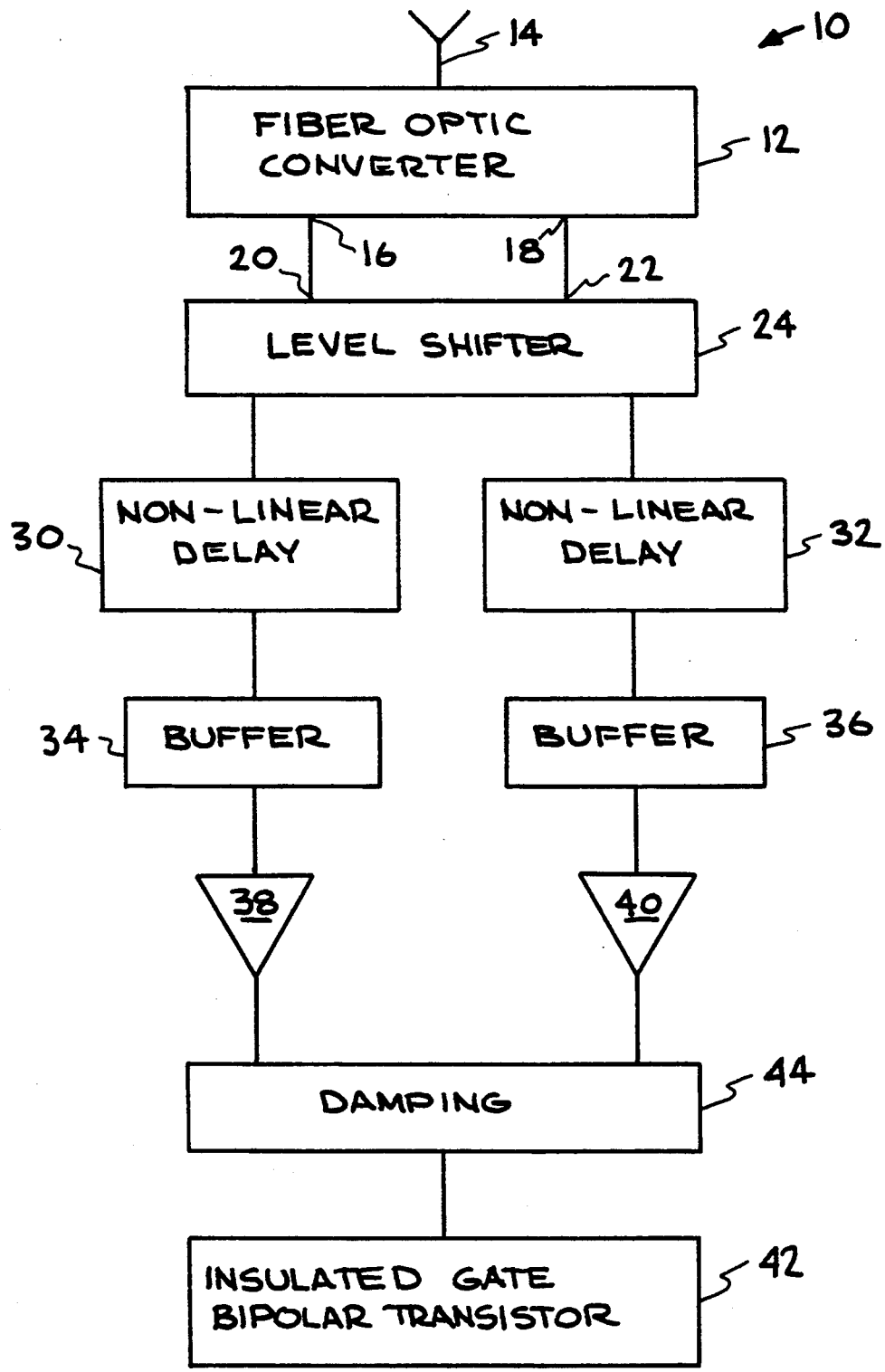
FIG. 1 is a block schematic diagram of the improved base drive circuit of the present invention.

A base drive circuit according to the present invention is shown in the block schematic diagram of FIG. 1, and is designated therein by the general reference character 10. In the best presently known embodiment 10 of the present invention, a fiber-optic converter chip 12 receives a control input on a fiber-optic line 14 and selectively causes a first input switch port 16 to be alternately connected and disconnected internally from a second input switch port The fiber-optic converter chip 12 is a standard "off the shelf" item. The fiber-optic converter chip 12 is not a necessary component of the invention, as any means for selectively opening and closing the path between the input switch ports 16 and 18, such as an electro-mechanical switch (not shown) or a conventional electronic switch (not shown) might be employed for the purpose. The fiber-optic converter chip 12 is used in conjunction with the best presently known embodiment 10 of the present invention to provide the additional advantage of complete electrical isolation from earth ground (the fact that the invention is capable of operating in this mode being an additional advantage thereof), and because the fiber-optic line 14 is a convenient means for transmitting a control signal.

The first and second input switch ports 16 and 18 are electrically connected directly to a first phase splitter input 20 and a second phase splitter input 22 of a level shifter 24. The level shifter 24 provides a first bistable output 26 and a second bistable output 28 to a first non-linear delay 30 and a second non-linear delay 32, respectively. The non-linear delays 30 and 32, in turn, provide input signals to a first buffer subcircuit 34 and a second buffer subcircuit 36, respectively. The buffer subcircuits 34 and 36 invert the output of the non-linear delays 30 and 32 and provide the inverted signal to a first output stage 38 and a second output stage 40, respectively. The output stages 38 and 40 control a subject IGBT 42 through a damping and protection network 44.

Figure 2:
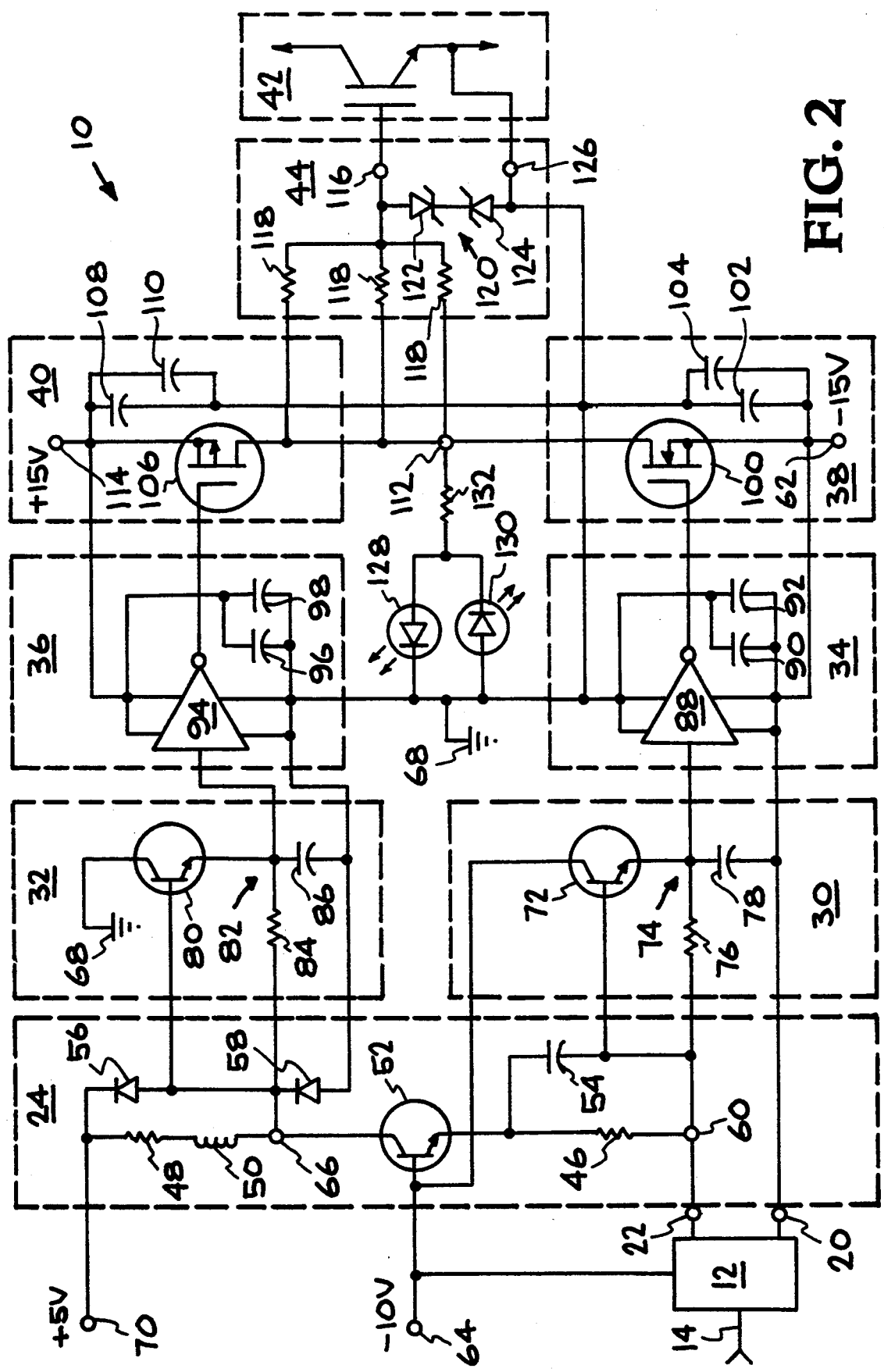
FIG. 2 is a detailed schematic diagram of the improved base drive circuit of FIG. 1.

FIG. 2 is a detailed schematic diagram of the best presently known embodiment 10 of the present invention. As can be seen in the view of FIG. 2, the level shifter 24 has a first resistor 46, a second resistor 48, an inductor 50, a first transistor 52, a first capacitor, a first diode 56 and a second diode 58. One skilled in the art will recognize that when the first level shifter input 20 is shorted to the second level shifter input 22 through the fiber-optic converter 12, a first test point 60 will be effectively connected to a −15 v supply point 62. When the path between the first level shifter input 20 and the second level shifter input 22 through the fiber-optic converter 12 is opened, the first test point 60 will drop to an approximate −10 v level, which voltage is provided to the best presently known embodiment 10 of the present invention at a −10 v supply point 64.

A second test point 66 toggles between +5 v and 0 v relative to a local ground 68, depending upon whether the first transistor 52 is conducting which, in turn, depends upon whether the first test point 60 is at −10 or at −15 v (conduction in the first transistor 52 occurring when the first test point 60 is at −15 v). The +5 v is provided at a +5 v supply point 70. In the best presently known embodiment 10 of the present invention, the first resistor 46 and the second resistor 48 are provided as biasing resistors to set the current limits through the first transistor 52. The inductor 50 and the first capacitor 54 are provided to compensate for stray capacitance and inductance to provide for maximum rise time of the first transistor 52. The first diode 56 and the second diode 58 clamp the second test point such that it cannot go more negative than 0 v. As can be appreciated in light of the above discussion, the level shifter 24 serves the function of providing signals at the first test point 60 and the second test point 66 which are shifted in level as described above.

The first non-linear delay 30 has a second transistor 72 and a first R/C delay network 74. The first R/C delay network 74 has a third resistor 76 and a second capacitor The second non-linear delay 32 has a third transistor 80 and a second R/C delay network 82. The second R/C delay network 82 has a fourth resistor 84 and a third capacitor 86. One skilled in the art will recognize that when the first test point 60 goes more negative (from −10 to −15 v), the effect of that transition will be delayed at the first buffer subcircuit 34 by the first R/C delay network 74. Similarly, when the second test point 66 goes more positive (from 0 v to +5 v), the effect of that transition will be delayed at the second buffer subcircuit 36 by the second R/C delay network 82. However, when the first test point 60 goes more positive (from −15 v to −10), the second transistor 72 will effectively shunt the first R/C delay network 74, and that transition will be nearly instantaneous. Similarly, when the second test point 66 goes more negative (from +5 v to 0 v), the third transistor 80 will effectively shunt the second R/C delay network 82, and that transition will be nearly instantaneous. The second and third transistors 72 and 80 are used to shunt the R/C delay networks 74 and 82, rather than a pair of diodes (not shown) which would also perform that function, in order to reduce loading on the level shifter 24.

The first buffer subcircuit 34 has a first buffer component 88, a fourth capacitor 90 and a fifth capacitor 92. The second buffer subcircuit 36 has a second buffer component 94, a sixth capacitor 96 and a seventh capacitor 98. The buffer components 88 and 94 are commonly available components used in the best presently known embodiment 10 of the present invention to buffer the 5 volt swings occurring at their inputs from the 15 volt swings which will occur at their output, as will be described hereinafter. Because the present invention provides that the buffer components 88 and 94 will never be subjected to the entire potential swing which might occur at their outputs without the inventive non-linear delay subcircuits 30 and 32, the buffer components 88 and 94 may be of a type which would not withstand such a potential swing. As can be seen in the view of FIG. 2, an inverted output of the buffer components 88 and 94 is used in the best presently known embodiment 10 of the present invention. The fourth, fifth, sixth and seventh capacitors 90, 92, 96 and 98 are provided for smoothing the output of the buffer components 88 and 94 and reducing any transients present.

The first output stage 38 has an N-channel field effect transistor 100, an eighth capacitor 102 and a ninth capacitor 104. The second output stage 40 has a P-channel field effect transistor 106, a tenth capacitor 10S and an eleventh capacitor 104. The N-channel field effect transistor 100 acts as an on/off switch between the −15 v supply point 62 and a third test point 112, and the P-channel field effect transistor 106 acts as an on/off switch between a +15 v supply point 114 and the third test point 112. Voltage present at the third test point 112 is provided to a gate connector 116 of the IGBT 42 through three damping resistors 118 in the damping and protection network 44. Also in the damping and protection network 44 are a back-to-back zener diode pair 120, having a first zener diode 222 and a second zener diode 124, is provided as shown to serve as a transient overload protection device. An emitter connector 126 of the IGBT 42 is tied to the local ground 68 and the eighth, ninth, tenth and eleventh capacitors 102, 104, 108 and 110 are provided for filtering any transients there present. The damping resistors 128 are provided to damp parasitic oscillation from the IGBT 42. A unique feature of the best presently known embodiment 10 of the present invention is that the IGBT 42 physically connects directly to the gate connector 116 and the emitter connector 126 on the circuit board of the inventive gate drive circuit 10.

In the best presently known embodiment 10 of the present invention a first light emitting diode 128 and a second light emitting diode 130 are positioned as shown in the view of FIG. 2 such that one or the other of the light emitting diodes 128 or 130 is lit, depending upon the instantaneous polarity of the voltage present at the test point three 112. The light emitting diodes 128 and 130 are employed in the best presently known embodiment 10 of the present invention merely as status indicators and for assisting in trouble shooting. A fifth resistor 132 is provided for limiting current through the light emitting diodes 128 and 130.

As described above, it can be seen that the first test point 60 and the second test point 66 switch generally simultaneously. However, as has been discussed above in relation to the prior art, there are many applications in which generally simultaneous bipolar switching is just not sufficiently precise. In the present example, if both of the field effect transistors 100 and 106 were to be driven on simultaneously, the −15 v supply point 62 would be effectively shorted directly to the +15 v supply point 114. In the past, this situation might have been made tolerable by providing protection or delay circuits (not shown) associated with the two 15 v supply points 62 and 114 and/or by providing components or additional current limiting or protection circuits (not shown) which could tolerate the current surge resulting from that condition. However, all of these solutions would require either a greater number of and/or larger and more expensive components, and none would have resulted in the rapid bidirectional bipolar switch-over which is ideal for controlling the IGBT 42 switch.

In order to insure that one skilled in the art might readily practice the present invention, a TABLE 1, listing the values and identification of individual components of the best presently known embodiment 10 of the present invention is being provided herein.

TABLE 1

| 12 | fiber-optic convertor | HFBR-2501 |
|---|---|---|
| 46 | first resistor | 430 Ω |
| 48 | second resistor | 560 Ω |
| 50 | inductor | 10 μH |
| 52 | first transistor | 2N2219 |
| 54 | first capacitor | 47 pF |
| 56 | first diode | 1N4148 |
| 58 | second diode | 1N4148 |
| 72 | second transistor | 2N3904 |
| 76 | third resistor | 1 kΩ |
| 78 | second capacitor | 47 pF |
| 80 | third transistor | 2N3906 |
| 84 | fourth resistor | 1 kΩ |
| 86 | third capacitor | 47 pF |
| 88 | first buffer component | TSC429 |
| 90 | fourth capacitor | 0.1 μF |
| 92 | fifth capacitor | 2.2 μF |
| 94 | second buffer component | TSC429 |
| 96 | sixth capacitor | 0.1 MF |
| 98 | seventh capacitor | 2.2 μF |
| 100 | N-channel field effect transistor | IRFD110 |
| 102 | eight capacitor | 0.1 μF |
| 104 | ninth capacitor | 2.2 μF |

TABLE 1-continued

| 106 | P-channel field effect transistor | IRFD9120 |
|---|---|---|
| 108 | tenth capacitor | 0.1 μF |
| 110 | eleventh capacitor | 2.2 μF |
| 118 | damping resistors (3) | 15 Ω |
| 122 | first zener diode | 1N4748 |
| 124 | second zener diode | 1N4748 |
| 132 | fifth resistor | 2.7 kΩ |

Various modifications may be made to the invention without altering its value or scope. For example, the levels and polarities could be altered described herein could be altered such that either the second transistor 72 or the third transistor 80 is turned off in order to turn on the corresponding filed effect transistor 100 or 106, in which case a non-inverted output of the corresponding buffer component 88 or 94 would be used. Another obvious variation would be to use discrete components as buffers instead of the buffer components 88 and 94 and/or to effect level changes in other parts of the circuitry such that the buffer components 88 and 94 would not be required.

All of the above are only some of the examples of available embodiments of the present invention. Those skilled in the art will readily observe that numerous other modifications and alterations may be made without departing from the spirit and scope of the invention. Accordingly, the above disclosure is not intended as limiting and the appended claims are to be interpreted as encompassing the entire scope of the invention.

INDUSTRIAL APPLICABILITY

The improved base drive circuit 10 is intended to replace conventional means for controlling electronic switches, particularly IGBT devices intended for switching very high power sources. Such high power switching requirements are found in applications including high energy electron beam power supply circuits, control of electric motors, and the like. It is critical that a rapid bias change be induced at the gate of an IGBT when switching high power because power is dissipated by the IGBT during switching. A similar related application would be to use the inventive improved base drive circuit to control an IGBT used for disconnecting a power supply from its load in the event of a fault on the load. It is anticipated that the inventive means for providing this rapid bias change will be widely accepted because it combines the advantages of an extreme change past the zero voltage point with both a rapid rise time and a rapid fall time.

As presently applied, the best presently known embodiment 10 of the present invention the IGBT 42 switches approximately 1200 volts at 300 to 400 amperes. In this application switching is accomplished at a 20 KHz cycle rate, although the invention could be equally applied in applications which require only intermittent or "one shot" operation. Switching times of well under 50 nS have been accomplished using the present inventive improved base drive circuit 10.

The improved base drive circuit 10 may be utilized in any application wherein conventional switching control circuits are used, and will provide improved switching times and reliability. The improved base drive circuit 10 may be employed in any application wherein a rapid bidirectional transition between bipolar control voltages is required. The non-linear delays 30 and 32 allow for the near instantaneous bipolar switching while curing the accompanying problem of possible simultaneous "on" states of the two bistable switches. Therefore, it is expected that it will be acceptable in the field as a substitute for the conventional means for controlling electronic switches and, further, that will extend the usable range of. For these and other reasons, it is expected that the utility and industrial applicability of the invention will be both significant in scope and long-lasting in duration.

I claim:

1. A bistable drive circuit for an electronic switching device, comprising:

a level shifting means for accepting a bistable input signal and providing a first bistable reference point and a second bistable reference point, the first bistable reference point and the second bistable reference point both being triggered as a function of the bistable input signal;

a first non-linear delay subcircuit and a second non-linear delay subcircuit, each of said non-linear delays having a resistor/capacitor delay network and a unidirectional shunting means for shunting the resistor/capacitor delay network in one direction only;

a first solid-state output device and a second solid state output device, said first solid-state output device being electrically connected to the first bistable reference point through said first non-linear delay subcircuit and said second solid-state output device being electrically connected to the second bistable reference point through said second non-linear delay subcircuit.

2. The bistable drive circuit of claim 1, wherein:

the unidirectional shunting means are transistors biased such that they will conduct only as voltage is applied across the associated resistor/capacitor delay network in one direction.

3. The bistable drive circuit of claim 1, wherein:

said level shifting means includes a transistor biased such that the second bistable reference point goes high generally simultaneously with the first bistable reference point and further such that both the high and low states of the second bistable reference point are at different potentials than corresponding simultaneous states of the first bistable reference point.

4. The bistable drive circuit of claim 3, wherein:

said first solid-state output device is biased such that it conducts when the first bistable reference point goes high; and said second solid-state output device is biased such that it conducts when the second bistable reference point goes high.

5. The bistable drive circuit of claim 1, wherein:

said first solid-state output device is biased such that it conducts generally when said second solid-state output device is not conducting.

6. The bistable drive circuit of claim 1, wherein:

said first solid-state output device includes a P-channel field effect transistor and said second solid-state output device includes an N-channel field effect transistor.

7. The bistable drive circuit of claim 1, and further including:

a first buffer and a second buffer, the first buffer and the second buffer each including a buffer component device for isolating the associated of said solid-state output devices from the associated of said non-linear delay subcircuits and said level shifting means.

8. The bistable drive circuit of claim 1, wherein:

trigger input for said level shifting means is provided by a fiber-optic receiver, the fiber-optic receiver being a switch controlled by a light signal.

9. The bistable drive circuit of claim 1, wherein:

said two solid-state output devices have a common output point such that the sum of the voltages provided by said solid-state output devices is present at the common output point.

10. The bistable drive circuit of claim 9, wherein:

said first solid-state output device switches a negative voltage source to the common output point and said second solid-state output device switches a positive voltage source to the common output point.

11. The bistable drive circuit of claim 9, wherein:

the electronic switching device is connected to the common output point such that the control signal presented to the electronic switching device is the voltage present at the common output point.

12. The bistable drive circuit of claim 9, wherein:

the electronic switching device is physically connected directly to the bistable drive circuit and is further electrically connected directly to the common output point.

13. The bistable drive circuit of claim 1, wherein:

the electronic switching device is an insulated gate bipolar transistor.

14. An electronic switching circuit, comprising:

an insulated gate bipolar transistor;

a first driving switch and a second driving switch, said first driving switch switching a negative voltage source to a gate connector of the insulated gate bipolar transistor and said second driving switch switching a positive voltage source to the gate connector of the insulated gate bipolar transistor, said first driving switch being biased such that it switches on generally when said second driving switch is switched off; and a first non-linear delay subcircuit and a second non-linear delay subcircuit, each of the non-linear delay subcircuits including a delay network and a unidirectional shunting means for shunting the delay network in one direction only, the first non-linear delay circuit being interposed between said first driving switch and a first reference control point and the second non-linear delay circuit being interposed between said second driving switch and a second reference control point.

15. The electronic switching circuit of claim 14, wherein:

the unidirectional shunting means of said first non-linear delay subcircuit is biased such that positive going changes in potential across the associated of said delay networks are shunted; and the unidirectional shunting means of said second non-linear delay subcircuit is biased such that negative going changes in potential across the associated of said delay networks are shunted.

16. The electronic switching circuit of claim 14, wherein:

said non-linear delay subcircuits are connected such that the turn on time of each of said driving switches is delayed while the turn off time of each of said driving switches is not delayed.

17. The electronic switching circuit of claim 14, wherein:

said first driving switch and said second driving switch are connected to a common output point such that, if said first driving switch and said second driving switch were to conduct simultaneously, the positive voltage source would be connected to the negative voltage source through said first driving switch and said second driving switch.

18. The electronic switching circuit of claim 14, and further including:

a first buffer, the first buffer being interposed between said first driving switch and the first reference control point; and a second buffer, the second buffer being interposed between said second driving switch and the second reference control point.

19. The electronic switching circuit of claim 14, wherein:

the first reference control point and the second reference control point are provided by a level shifting means, the level shifting means including a level shifting transistor biased such that a single bistable input provides a first bistable output at the first reference control point and a second bistable output at the second reference control point.

20. The electronic switching circuit of claim 14, wherein:

the first reference control point and the second reference control point go high generally simultaneously.

* * * * *